(12) United States Patent
Andideh

(10) Patent No.: US 7,026,670 B2
(45) Date of Patent: Apr. 11, 2006

(54) FERROELECTRIC MEMORY DEVICE WITH A CONDUCTIVE POLYMER LAYER AND A METHOD OF FORMATION

(75) Inventor: Ebrahim Andideh, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/427,162

(22) Filed: Apr. 30, 2003

(65) Prior Publication Data

US 2004/0217402 A1    Nov. 4, 2004

(51) Int. Cl.
*H01L 29/72* (2006.01)
(52) U.S. Cl. .................. 257/295; 257/40; 257/296
(58) Field of Classification Search ............. 257/296, 257/295

See application file for complete search history.

(56) References Cited

U.S. PATENT DOCUMENTS

2003/0224535 A1 * 12/2003 Andideh et al. ............... 438/3

* cited by examiner

*Primary Examiner*—Edward Wojciechowicz
(74) *Attorney, Agent, or Firm*—Michael A. Proksch

(57) ABSTRACT

A ferroelectric memory device and a method of formation are disclosed. In one particular embodiment, a ferroelectric memory device comprises a first electrode layer formed on a substrate, a ferroelectric polymer layer formed on substantial portion of a first electrode layer, a thin layer of conductive ferroelectric polymer formed on a substantial portion of the ferroelectric polymer layer, where the ferroelectric polymer may be made conductive by doping with conductive nano-particles, and a second electrode layer formed on at least a portion of the carbon doped ferroelectric polymer layer.

23 Claims, 5 Drawing Sheets

US 7,026,670 B2

FERROELECTRIC MEMORY DEVICE WITH A CONDUCTIVE POLYMER LAYER AND A METHOD OF FORMATION

BACKGROUND

Ferroelectric devices such as ferroelectric polymer memory devices may comprise one or more layers of ferroelectric material sandwiched between layers of electrodes. Methods of formation of devices such as ferroelectric polymer memory devices may vary, but one method may comprise depositing a layer of ferroelectric polymer on a first electrode layer, and then depositing and patterning a second electrode layer on a substantial portion of the ferroelectric polymer layer. However, methods for depositing the second electrode layer may be limited, and state of the art deposition methods may result in high defect density in the interface between the second electrode layer and the ferroelectric polymer layer.

A need, therefore, exists for an improved method of forming a ferroelectric polymer memory that addresses at least some of these concerns.

BRIEF DESCRIPTION OF THE DRAWINGS

The subject matter regarded as embodiments of the claimed subject matter is particularly pointed out and distinctly claimed in the concluding portion of the specification. Embodiments of the claimed subject matter, however, both as to organization and method of operation, together with objects, features, and advantages thereof, may best be understood by reference to the following detailed description when read with the accompanying drawings in which:

DETAILED DESCRIPTION

Figure 5:
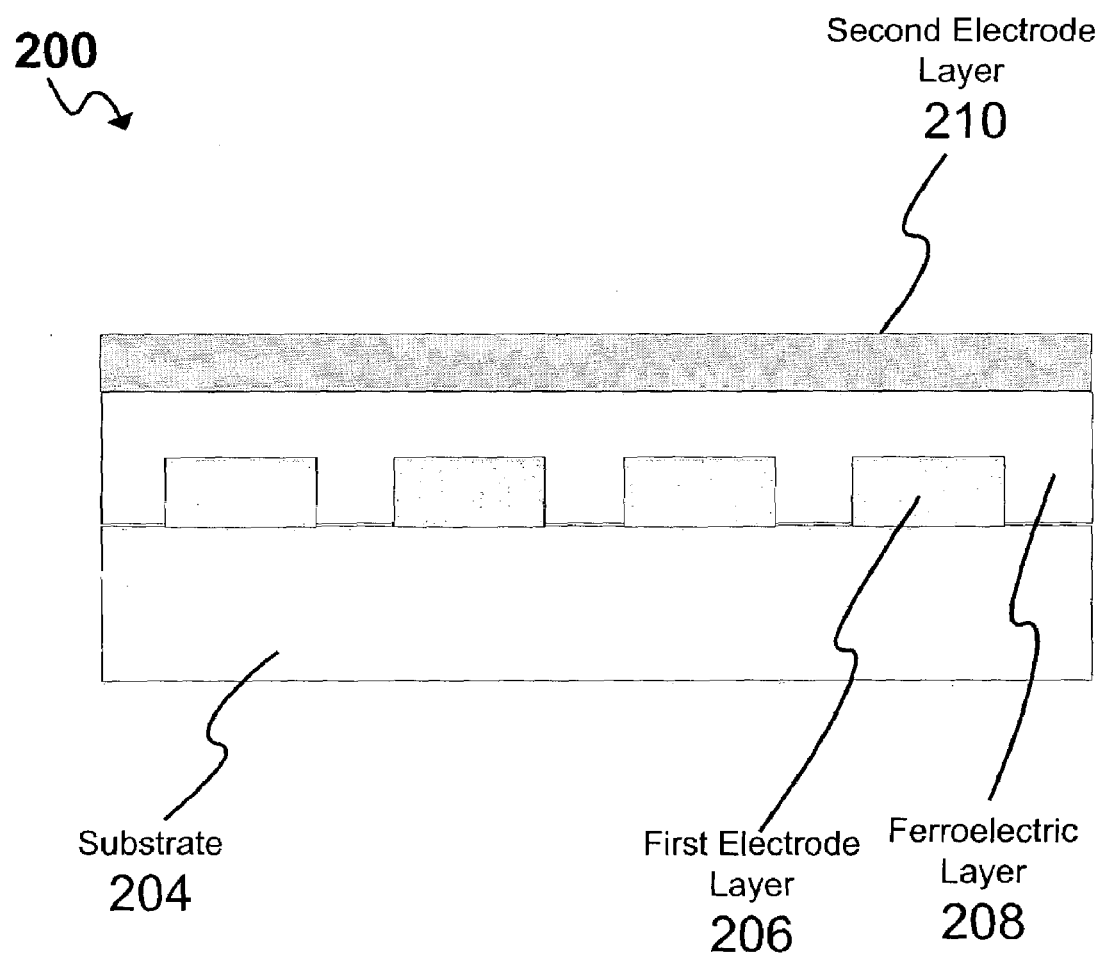
FIG. 5 illustrates an elevational cutaway view of a ferroelectric device as known in the art.

Embodiments of the claimed subject matter may comprise a ferroelectric memory device with a conductive polymer layer and a method of fabrication. FIG. 5 illustrates an elevational cutaway view of a ferroelectric memory device as known in the art. Shown in FIG. 5 is a semiconductor substrate 204, which may be an insulating layer comprised of SiO$_2$, with a first electrode layer 206, which may comprise a plurality of electrodes, for example. A ferroelectric layer 208 is formed on the substrate 204 and first electrode layer 206. A second electrode layer 210 is formed on the top surface of layer 208. In this embodiment of a well-known memory device, substrate 204 may comprise a substrate of CMOS (complimentary metal oxide semiconductor), for example. A first electrode layer 206 may be formed on the substrate by a deposition process such as physical vapor deposition (PVD), for example, and may be patterned by use of a photolithography and etch process, for example. A deposition process such as spin deposition may be used to deposit the ferroelectric layer 208. Typically, an evaporation process is used to deposit the second electrode layer 210. An evaporation process may be used, because other deposition processes such as sputter deposition will typically result in property degradation to layer 208, causing device 200 to be functionally inadequate. However, use of an evaporation process for formation of second electrode layer 210 typically results in a high density of interface defects, reducing the yield rate and/or quality of devices formed by use of the above-described process. Additionally, use of dissimilar materials for the polymer and metal layers may cause undesirable interface reactions including delamination, for example.

One embodiment of the claimed subject matter may comprise a method of forming a ferroelectric memory device by depositing a ferroelectric polymer layer on substantial portion of a first electrode layer, depositing a thin layer of conductive ferroelectric polymer on a substantial portion of the ferroelectric polymer layer, wherein the conductive ferroelectric polymer is doped with conductive particles such as nano-particles, annealing of the two layers, and depositing and patterning of a second electrode layer on at least a portion of the carbon doped ferroelectric polymer layer.

It is worthy to note that any reference in the specification to "one embodiment" or "an embodiment" means that a particular feature, structure, or characteristic described in connection with the embodiment is included in at least one embodiment of the claimed subject matter. The appearances of the phrase "in one embodiment" in various places in the specification are not necessarily all referring to the same embodiment.

Numerous specific details may be set forth herein to provide a thorough understanding of the embodiments of the claimed subject matter. It will be understood by those skilled in the art, however, that the embodiments of the claimed subject matter may be practiced without these specific details. In other instances, well-known methods, procedures, components and circuits have not been described in detail so as not to obscure the embodiments of the claimed subject matter. It can be appreciated that the specific structural and functional details disclosed herein may be representative and do not necessarily limit the scope of the claimed subject matter.

Figure 1:
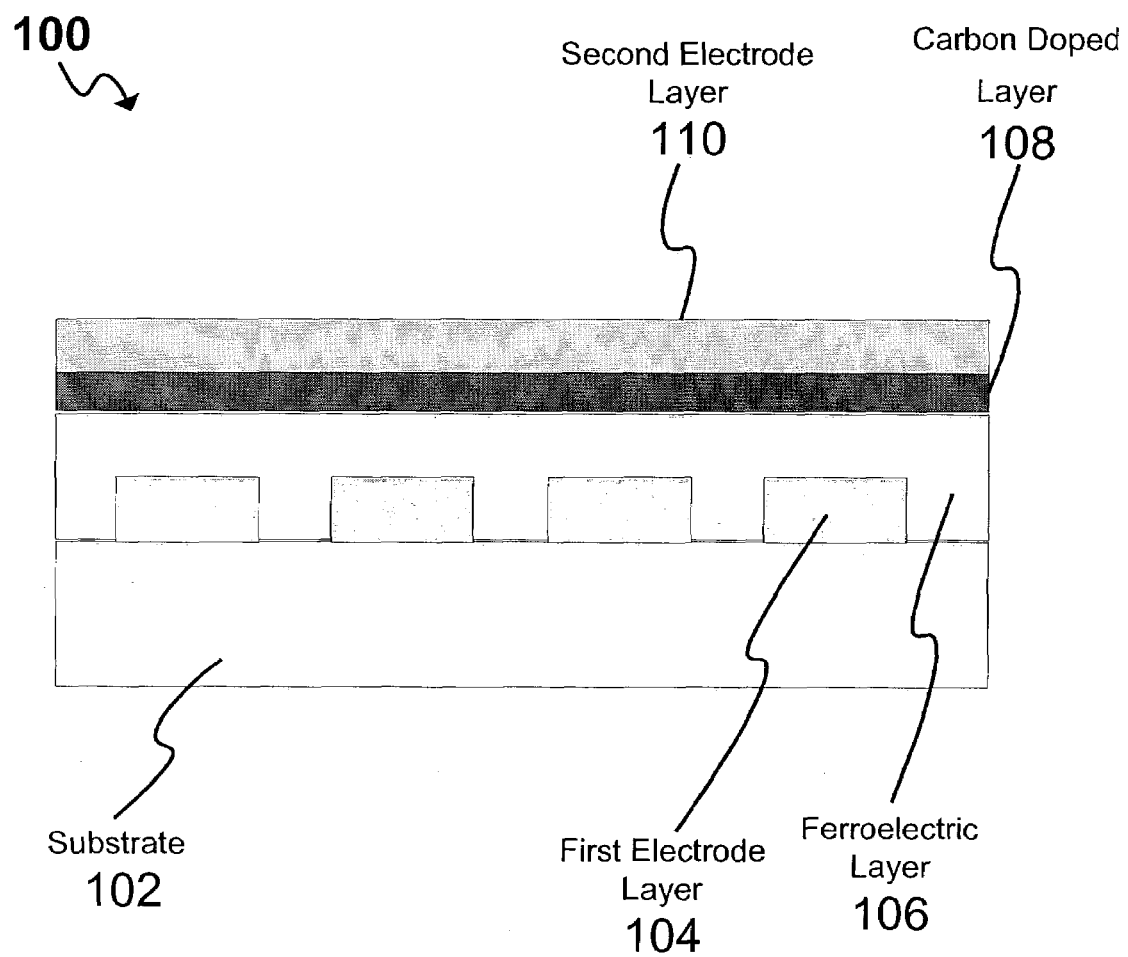
FIG. 1 illustrates an elevational cutaway view of a ferroelectric device in accordance with one embodiment of the claimed subject matter.

Referring now in detail to the drawings wherein like parts are designated by like reference numerals throughout, there is illustrated in FIG. 1 a ferroelectric memory device, in accordance with one embodiment of the claimed subject matter. Shown in FIG. 1 is a device comprising a substrate 102, which may comprise an insulating layer comprised of SiO$_2$ material, for example. Formed on substrate 102 is first electrode layer 104, which may comprise a plurality of metal devices such as electrodes. The first electrode layer 104 may be formed by use of one or more deposition processes, for example, although the claimed subject matter is not so limited. In one embodiment, electrode layer 104 is formed by depositing a layer of metal by use of a physical vapor deposition process, and patterning of the metal material into electrodes by use of one or more photolithography and etch processes.

Formed on at least a portion of the substrate 102 and first electrode layer 104 is a ferroelectric polymer layer 106. Ferroelectric polymer layer 106 may comprise one or more layers of polymer based material, including but not limited to polyvinyl and polyethylene fluorides, polyvinyledene fluoride (PVDF), polyvinyl and polyethylene chlorides, polyacrylonitriles, polyamides, polyfluorides, copolymers thereof, and combinations thereof, although it is important to note that the claimed subject matter is not limited to one or more of the materials listed above. Layer 106 may be deposited by one or more spin deposition processes, although it is important to note that the claimed subject matter is not so limited, and any process that results in the deposition of a ferroelectric layer on a substantial portion of substrate 102 and first electrode layer 104 is in accordance with at least one embodiment of the claimed subject matter.

Formed on a substantial portion of ferroelectric layer 106 is a layer of conductive ferroelectric polymer 108. The ferroelectric polymer used to form layer 108 may be made conductive by doping the material with conductive particles such as nano-particles, for example. In this context, nano-particles are particles of material wherein the diameter of the particles is in the range of approximately 1 to 5 nanometers. Layer 108 may comprise a ferroelectric polymer doped with conductive nano-particles such as carbon black nano-particles, for example. In this embodiment, the ferroelectric polymer is doped with conductive carbon black nano-particles, in a carbon black doping (CBD) process, for example. Carbon black, as is well known, is a form of amorphous carbon that may be used as an additive in materials such as polymers, for example. In this embodiment, a ferroelectric polymer material is doped with carbon black to form a carbon doped ferroelectric polymer. In one embodiment, the ferroelectric polymer material may be doped with a plurality of nano-particles of carbon black to approximately 2–5% of carbon black by weight, although the claimed subject matter is not so limited. It is noted that any doping of a ferroelectric polymer, which results in the doped ferroelectric polymer being changed from a dielectric to conductive is in accordance with at least one embodiment of the claimed subject matter. Additionally, the ferroelectric polymer material doped may be the same polymer material used to form layer 106, for example, although the claimed subject matter is not so limited.

After doping of a ferroelectric polymer, the doped ferroelectric polymer may be deposited to form layer 108. Formation of layer 108 may vary, but one particular embodiment comprises formation of layer 108 by use of one or more spin deposition processes, although any fabrication process that results in the formation of a layer of a conductive ferroelectric polymer on a substantial portion of a ferroelectric polymer layer is in accordance with the claimed subject matter. In this embodiment, after formation of layer 108, the partially formed device may undergo one or more annealing processes. Numerous methods of annealing the partially formed device may be used in various embodiments, but the claimed subject matter is not limited to any particular method.

Formed on layer 108 is a second electrode layer 110. Second electrode layer 110 may be formed on a substantial portion of the top surface of layer 108, for example. Formation may vary, but it is envisioned that one particular embodiment of forming second electrode layer 110 may incorporate one or more physical vapor deposition processes, such as sputter deposition, for example. Use of a sputter deposition process may reduce the interface defects and other undesirable properties that may result from use of other processes, as described previously. After formation of a metal layer, formation of the second electrode layer 110 may incorporate the use of one or more patterning processes, such as one or more photolithography and etch processes, for example.

Although device 100 is shown to contain only two layers of electrodes, the claimed subject matter is not so limited. A device such as device 100 may be formed to contain multiple layers of electrodes, and may be formed to contain an array of cross point memory cells, as shown in more detail in reference to FIG. 2. Additionally, device 100 may contain multiple layers of conductive ferroelectric polymer, and the dopant used in the various conductive layers may be similar, or may comprise different dopant materials, for example. In one embodiment, a multilayered polymer memory device may comprise repeating layers of electrodes, ferroelectric polymer, and carbon doped ferroelectric polymer. Additionally, a device such as device 100 may be configured for use in a device such as wireless device 169 of FIG. 4, which will be explained in more detail hereinafter.

Figure 2:
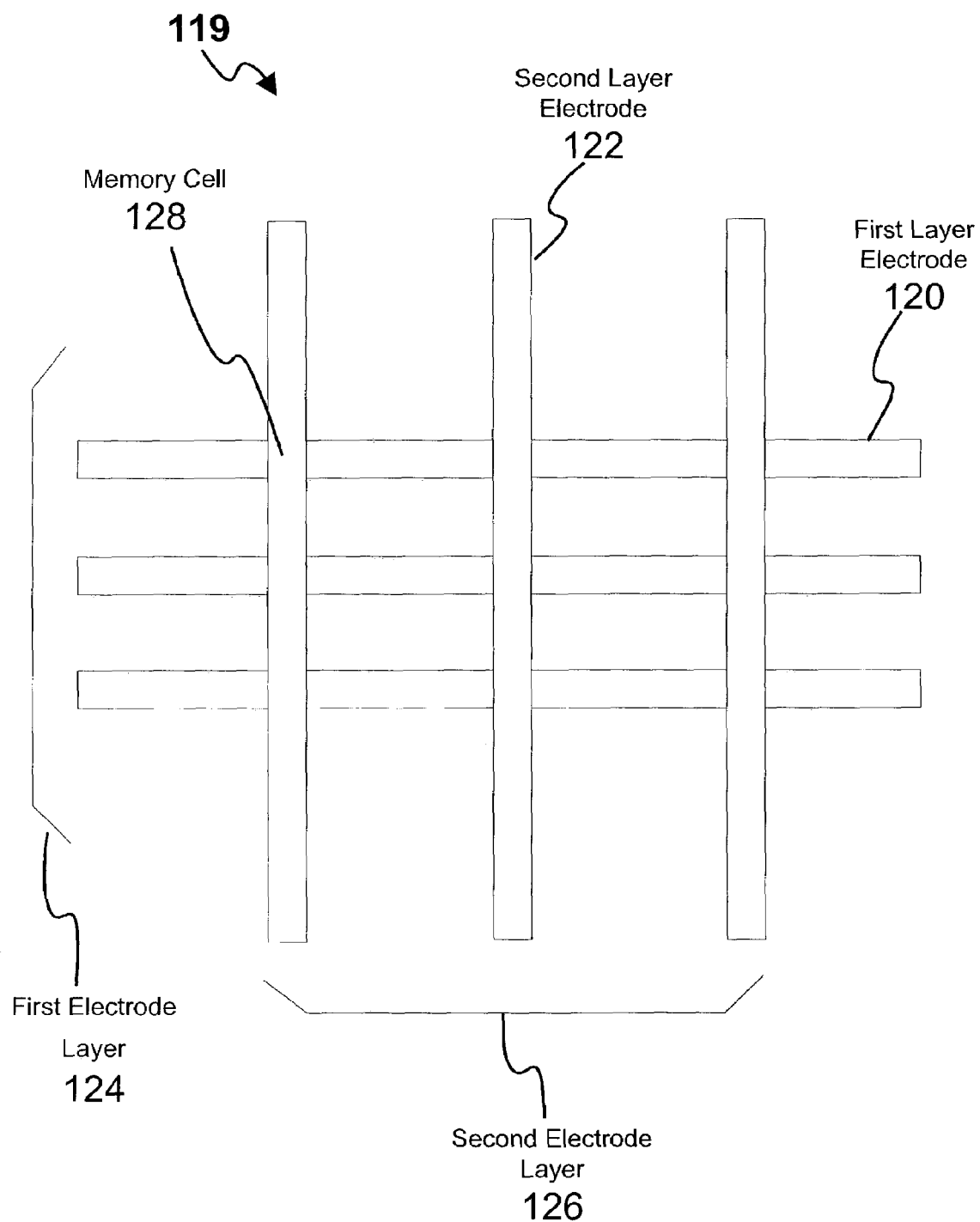
FIG. 2 is a schematic representation of an embodiment of a ferroelectric device in accordance with an embodiment of the claimed subject matter.

FIG. 2 illustrates a schematic representation of a portion 119 of a polymer memory device, which may incorporate a configuration as described in reference to FIG. 1. As shown in FIG. 2, a first electrode layer 124 may comprise a plurality of electrodes such as electrode 120, and a second electrode layer 126 may comprise a plurality of electrodes such as electrode 122, wherein the electrodes in each respective layer are configured to be substantially parallel to each other, for example. Additionally, the first and second electrode layers may be configured such that they are substantially orthogonal to each other, although the claimed subject matter is not so limited. Additionally, although not shown in detail, the electrode layers may be separated by ferroelectric material, as well as a conductive ferroelectric material, as explained in reference to FIG. 1. The cross over point, or intersection, of a first and second layer electrode may form a memory cell 128. This memory cell may be capable of holding a particular polarization, which may cause the memory cell to hold a representative value such as a '1' or a '0', for example, although the claimed subject matter is not limited to a memory cell that represents only 2 states. Additionally, it is important to note that the memory array portion 119 is for illustrative purposes only, and the claimed subject matter is not limited to a memory array with any particular number of memory cells, or to a device with only two electrode layers.

Figure 3:
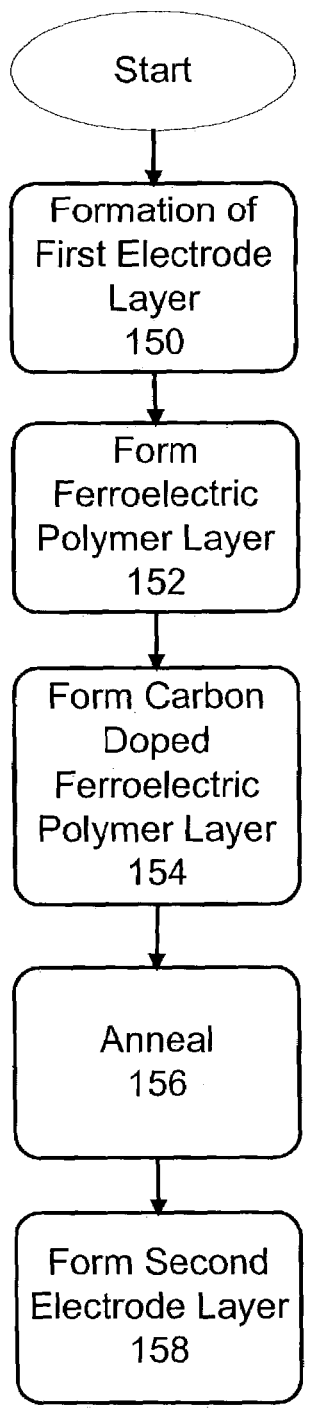
FIG. 3 is a block flow diagram of one method of forming a ferroelectric device in accordance with one embodiment of the claimed subject matter.

FIG. 3 illustrates the process flow of one particular method of forming a ferroelectric device with a conductive ferroelectric polymer layer, such as device 100 of FIG. 1. In this particular method, a first electrode layer is formed on a substrate at block 150, wherein the electrode layer may comprise one or more electrodes. A ferroelectric polymer layer is formed on a substantial portion of the substrate and the first electrode layer at block 152. A thin layer of conductive ferroelectric polymer is formed on a substantial portion of the top surface of the ferroelectric polymer layer at block 154. One or more annealing processes are performed on the partially formed device at block 156. A second electrode layer is formed on a substantial portion of the top surface of the carbon doped ferroelectric polymer layer at block 158, wherein the second electrode layer may comprise one or more electrodes.

In one embodiment, a substrate may be formed from a semiconducitve material such as silicon, by use of one or more well known wafer fabrication techniques. In this embodiment, at block 150, a substrate such as a CMOS or $SiO_2$ substrate may have formed thereon a first electrode layer. A first electrode layer may comprise one or more electrodes, and in one particular embodiment, a first electrode layer comprises a plurality of electrodes formed substantially parallel to one another. In this embodiment, the plurality of electrodes may be formed from titanium nitride (TiN) or tantalum nitride (TaN), by use of a deposition process such as physical vapor deposition and a subsequent patterning processes such as photolithography, although numerous methods of formation exist, and it is important to note that any method that results in the formation of a first electrode layer is in accordance with the claimed subject matter.

In this embodiment, at block 152, formation of a ferroelectric polymer layer may incorporate the use of a one or more ferroelectric polymer materials, such as one or more layers of materials such as various polymers, including but not limited to polyvinyl and polyethylene fluorides, polyvinyledene fluoride (PVDF) polymer, polyvinyl and polyethylene chlorides, polyacrylonitriles, polyamides, polyfluorides, copolymers thereof, and combinations thereof. Formation of the ferroelectric polymer layer may incorporate the use of one or more spin deposition processes, although any method that results in the formation of a ferroelectric polymer layer is in accordance with the claimed subject matter. In one exemplary embodiment, a ferroelectric polymer layer may be comprised of a copolymer of vinyledene fluoride and triflouroethylene (TrFE), and may be spin deposited to a thickness of 20 to 200 nanometers (nm), for example.

In this embodiment, at block 154, formation of a conductive ferroelectric polymer layer may incorporate the use of one or more ferroelectric polymer materials described previously, wherein the ferroelectric polymer is doped with conductive particles such as nano-particles, which may comprise a carbon material such as carbon black, for example. Formation of the conductive ferroelectric polymer layer may incorporate the use of one or more spin deposition processes, although any method that results in the formation of a ferroelectric polymer layer is in accordance with the claimed subject matter. In one exemplary embodiment, a doped ferroelectric polymer layer may be comprised of a copolymer of vinyledene fluoride and triflouroethylene, doped with approximately 2–5% by weight of nano-particles of carbon black, and may be spin deposited to a thickness within the range of approximately 10 nm to 80 nm, for example.

In this embodiment, at block 156, one or more anneal processes may be performed on the partially formed device. Numerous methods of annealing the partially formed device may be used such as furnace annealing or laser annealing, but in one embodiment, the partially formed device is subjected to a furnace annealing process using a particular heat and time range to cause the resultant partially formed device to exhibit desirable properties. It is important to note, however, that any heat treatment or annealing process that results in a device with a carbon doped ferroelectric polymer layer exhibiting desirable properties is in accordance with the claimed subject matter.

In this embodiment, at block 158, formation of a second electrode layer may incorporate the use of one or more physical deposition processes such as sputter deposition, although numerous methods of formation exist, and it is important to note that any method that results in the formation of a second electrode layer is in accordance with the claimed subject matter. However, as described previously, use of typical evaporation processes result in the formation of an electrode layer with high defect density, and use of one or more sputter deposition processes may result in the formation of a second electrode layer with a lower defect density, and may additionally allow the use of additional materials as electrode materials. In one exemplary embodiment, a second electrode layer is formed by depositing a layer of TiN or TaN, by use of a sputter deposition process. A subsequent patterning processes such as photolithography is then used to pattern the metal layer into a plurality of electrodes, where the plurality of electrodes are formed substantially orthogonal to the electrodes formed in the first electrode layer. As stated previously, devices in accordance with the claimed subject matter are not limited to just two layers of electrodes, and at least a portion of the method shown in FIG. 3 may be repeated for formation of multiple layers of electrodes in a multilayered polymer memory device.

Figure 4:
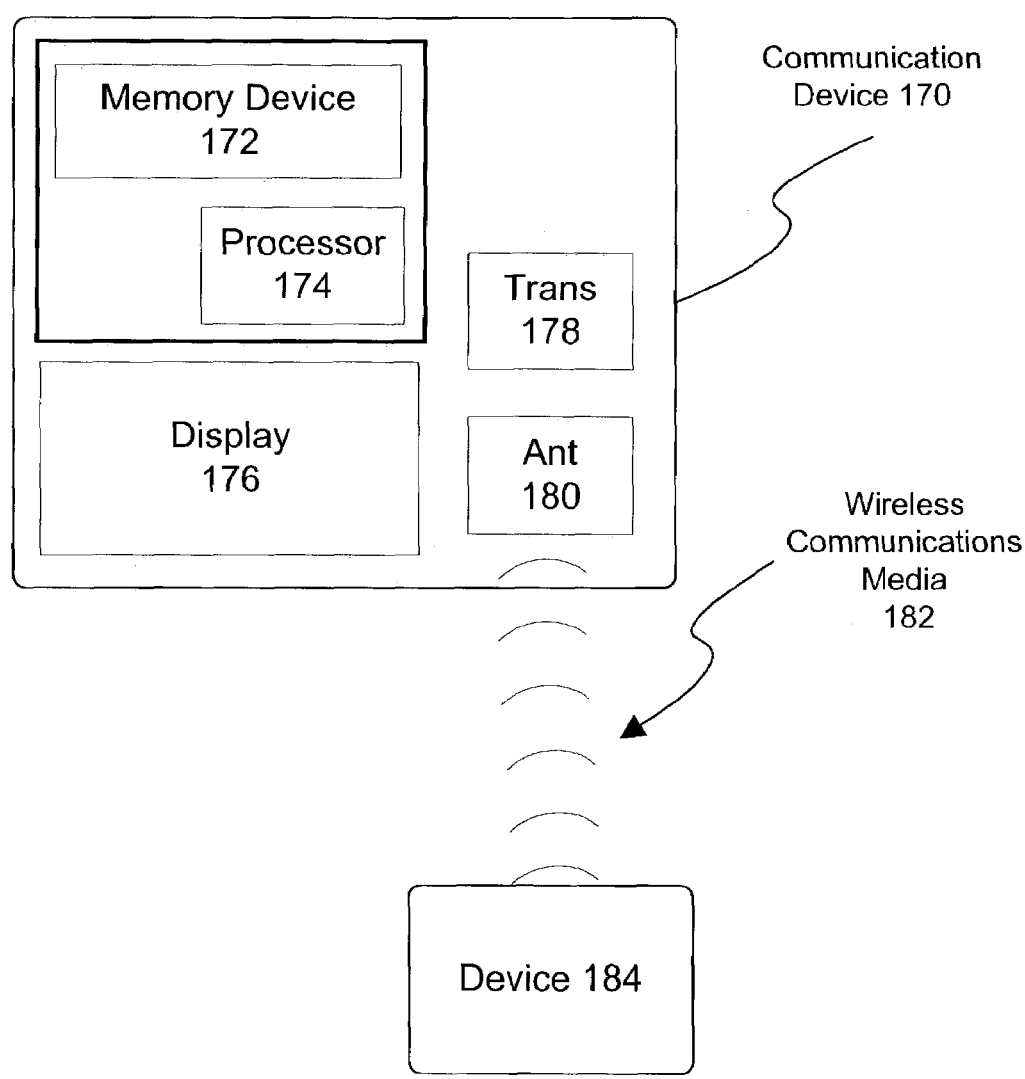
FIG. 4 is a block diagram of a wireless computing device, which may incorporate one or more embodiments of the claimed subject matter.

FIG. 4 is provided to illustrate an example of an application 169 for ferroelectric device 100 of FIG. 1, in accordance with one embodiment of the claimed subject matter. In this particular embodiment, a device such as device 100 is shown assembled as a memory device 172, which may comprise a structure as shown in FIG. 1, formed by use of the method as described in FIG. 3, for example. Memory device may, for example, be used as a stand alone memory that is used in a portable communication device 170, which may comprise, for example, a mobile communication device (e.g., cell phone), a two-way radio communication system, a one-way pager, a two-way pager, a personal communication system (PCS), a portable computer, or the like. Alternatively, memory 10 device 172 may be used in applications that are not regarded as mobile such as desktop computing systems, although it is important to note that these are exemplary embodiments, and the claimed subject matter is not so limited. Wireless computing device 172 may comprise a processor 174 to execute instructions and comprise a microprocessor, a central processing unit (CPU), a digital signal processor, a microcontroller, a reduced instruction set computer (RISC), a complex instruction set computer (CISC), or the like. Wireless computing device 172 may also optionally include a display 176 to display information to a user, and a transceiver 178 and antenna 180 to provide wireless communication.

It should also be understood that the scope of the claimed subject matter is not limited to stand alone memories. In alternative embodiments, memory device 172 may be formed within or embedded in other components of wireless computing device 170 such as in processor 174. In this embodiment, application 169 may comprise a device 184, which may be capable of receiving transmissions from antenna 180. Transmissions may be transmitted by use of wireless communications media 182, for example. It is important to note, however, that application 169 is an exemplary embodiment of one use of a ferroelectric device in accordance with the claimed subject matter.

It can be appreciated that the embodiments may be applied to the formation of any ferroelectric polymer device. Certain features of the embodiments of the claimed subject matter have been illustrated as described herein, however, many modifications, substitutions, changes and equivalents will now occur to those skilled in the art. Additionally, while several functional blocks and relations between them have been described in detail, it is contemplated by those of skill in the art that several of the operations may be performed without the use of the others, or additional functions or relationships between functions may be established and still be in accordance with the claimed subject matter. It is, therefore, to be understood that the appended claims are intended to cover all such modifications and changes as fall within the true spirit of the embodiments of the claimed subject matter.

What is claimed is:

1. A ferroelectric polymer memory device, comprising:
a first electrode layer formed on a semiconductor substrate, wherein the first electrode layer has a top surface and a bottom surface;
a ferroelectric polymer layer formed on a substantial portion of the top surface of said first electrode layer;
a conductive ferroelectric polymer layer formed over a substantial portion of said ferroelectric polymer layer; and
a second electrode layer, formed over at least a portion of said conductive ferroelectric polymer layer.

2. The ferroelectric polymer memory device of claim 1, wherein the conductive ferroelectric polymer layer comprises a ferroelectric polymer layer doped with a plurality of nano-particles.

3. The ferroelectric polymer memory device of claim 2, wherein at least a portion of the nano-particles comprise particles of carbon.

4. The ferroelectric polymer memory device of claim 3, wherein a substantial portion of the particles of carbon comprise carbon black.

5. The ferroelectric polymer memory device of claim 1, wherein the semiconductor substrate comprises a complimentary metal oxide semiconductor.

6. The ferroelectric polymer memory device of claim 1, wherein said first and said second electrode layers are substantially formed from one of: titanium nitride (TiN) or tantalum nitride (TaN).

7. The ferroelectric polymer memory device of claim 1, wherein said ferroelectric polymer layer is formed from a copolymer of vinyledene fluoride (VDF) and triflouroethylene (TrFE).

8. The ferroelectric polymer memory device of claim 7, wherein said ferroelectric polymer layer is formed by use of a spin deposition process, to a thickness of approximately 65 nanometers.

9. The ferroelectric polymer memory device of claim 1, wherein said conductive ferroelectric polymer layer comprises a copolymer of vinyledene fluoride (VDF) and triflouroethylene (TrFE), doped with approximately 2–5% by weight of carbon black, and formed to a approximate thickness within the range of 10 nanometers to 50 nanometers.

10. The ferroelectric polymer memory device of claim 1, wherein said first electrode layer and said second electrode layer respectively comprise a plurality of electrodes, formed substantially parallel with respect to each other.

11. The ferroelectric polymer memory device of claim 10, wherein the first and second electrode layer electrodes are formed substantially orthogonal with respect to each other.

12. An integrated circuit, comprising:
a semiconductor layer;
an electrode layer formed on the semiconductor layer;
a ferroelectric polymer layer formed on the electrode layer;
a conductive ferroelectric polymer layer formed on the ferroelectric polymer layer; and
an electrode layer formed on the conductive ferroelectric polymer layer.

13. The integrated circuit of claim 12, wherein the conductive ferroelectric polymer layer comprises a ferroelectric polymer layer doped with a plurality of nano-particles.

14. The ferroelectric polymer memory device of claim 13, wherein at least a portion of the nano-particles comprise particles of carbon.

15. The ferroelectric polymer memory device of claim 14, wherein the particles of carbon comprise carbon black.

16. The integrated circuit of claim 12, wherein said semiconductor layer includes a complimentary metal oxide semiconductor layer.

17. The integrated circuit of claim 12, wherein one or more of said electrode layers include one or more electrodes formed substantially from one of titanium nitride (TiN) or tantalum nitride (TaN).

18. The integrated circuit of claim 12, wherein said ferroelectric polymer layer includes vinyledene fluoride.

19. The integrated circuit of claim 12, wherein said ferroelectric polymer layer includes trifluoroethylene.

20. The integrated circuit of claim 12, wherein said integrated circuit comprises a polymer memory device.

21. A system comprising:
a ferroelectric polymer memory device including, a first electrode layer formed on a semiconductor substrate, wherein the first electrode layer has a top surface and a bottom surface, a ferroelectric polymer layer formed on a substantial portion of the top surface of said first electrode layer, a conductive ferroelectric polymer layer formed over a substantial portion of said ferroelectric polymer layer, and a second electrode layer, formed over at least a portion of said conductive ferroelectric polymer layer; and
one or more processor(s), coupled with the ferroelectric polymer memory device, to selectively access one or more memory elements of the ferroelectric polymer memory.

22. A system according to claim 21, further comprising:
a transceiver, coupled with the processor(s) and/or the ferroelectric polymer memory device, to enable the system to wirelessly communicate with a remote device.

23. A system according to claim 22, further comprising:
one or more antenna(e), responsive to the transceiver, through which the wireless communication with the remote device is effected.

* * * * *